United States Patent
Draxelmayr

(10) Patent No.: US 6,742,153 B1
(45) Date of Patent: May 25, 2004

(54) TEST CONFIGURATION AND METHOD FOR TESTING A DIGITAL ELECTRONIC FILTER

(75) Inventor: Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 740 days.

(21) Appl. No.: 09/621,431

(22) Filed: Jul. 21, 2000

(30) Foreign Application Priority Data

Jul. 21, 1999 (DE) .......................................... 199 34 296

(51) Int. Cl.[7] .................... G06F 11/00; G01R 23/165; H04J 15/00
(52) U.S. Cl. .................. 714/736; 324/76.68; 324/76.59
(58) Field of Search ................................ 714/724, 733, 714/734, 736, 742, 819, 824; 324/76.44, 76.59, 76.68; 704/219, 220, 229; 708/344; 455/307, 286

(56) References Cited

U.S. PATENT DOCUMENTS 4,305,076 A  * 12/1981 Lepere et al. ............... 342/165
5,504,756 A  *  4/1996 Kim et al. ................... 714/729
5,754,455 A     5/1998 Baker et al. ............ 364/724.17
6,014,554 A  *  1/2000 Smith ......................... 455/340
6,470,312 B1 * 10/2002 Suzuki et al. ............... 704/219
2003/0028372 A1 * 2/2003 McArthur et al. .......... 704/220

FOREIGN PATENT DOCUMENTS

JP           58-145 127      8/1983

OTHER PUBLICATIONS

Council, C. et al.: "Self–Test For F.I.R. Filters", Oct. 28, 1992, pp. 51–60, XP–002180895.*
A. Auer et al.: "Schaltungstest mit Boundary Scan" [test circuit with boundary scan], Hüthig Verlag, Heidelberg, 1996, pp. 6–13 (No in English).

* cited by examiner

Primary Examiner—Christine T. Tu
(74) Attorney, Agent, or Firm—Laurence A. Greenberg; Werner H. Stemer; Gregory L. Mayback

(57) ABSTRACT

A test configuration and a method for testing a digital electronic filter, include feeding back an output of the filter to an input in such a manner that a digital output signal from the filter is applied to the input as a test signal. The test signal is applied to the filter and a response signal is fed back to the input as the next test signal.

12 Claims, 1 Drawing Sheet

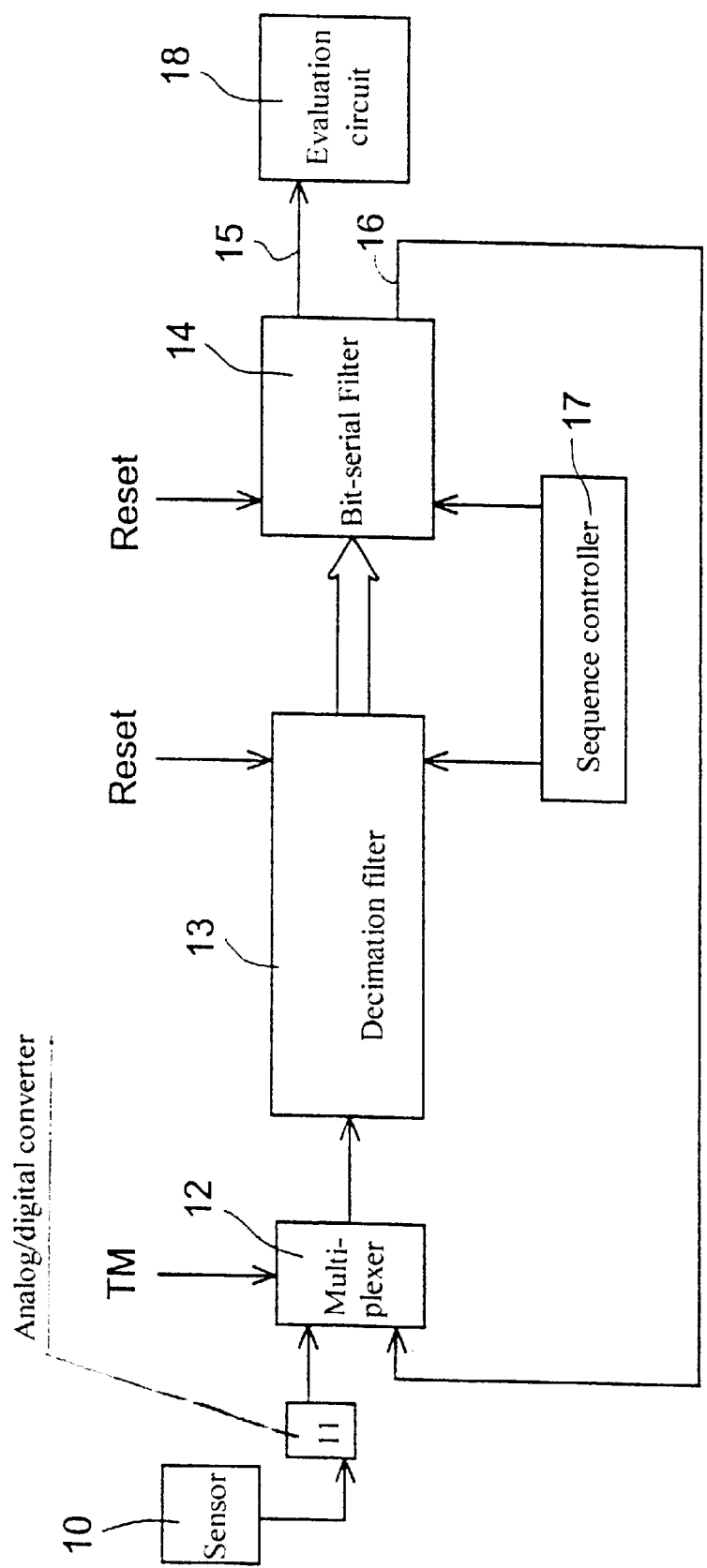

TEST CONFIGURATION AND METHOD FOR TESTING A DIGITAL ELECTRONIC FILTER

BACKGROUND OF THE INVENTION

Field of the Invention

The invention relates to a test configuration and a method for testing a digital electronic filter.

As integrated digital circuits become increasingly complex, it is becoming more and more difficult to test the circuits as completely as possible with a reasonable level of expenditure. So-called self-test configurations referred to as BISTs (Built-In Self-Tests) are known. They not only permit good test results to be attained, but also provide a possibility for checking the circuit in situ outside the production process without testers. In that context, an additional circuit is used to excite the circuit which is to be tested in such a way that a high level of fault coverage is thus achieved. Since that procedure is deterministic, the reaction of the circuit to be tested has thus been determined from the beginning and can therefore be checked by using comparison values. If the expected reaction is obtained, then the circuit is in order.

That requires a large number of different input signals to be provided in order to create the prerequisite for finding as many faults as possible. However, it would mean that a test pattern generator would be necessary, which would naturally be associated with an unwanted level of expenditure.

Patent Abstracts of Japan, E-212, Nov. 24, 1983, Volume 7, No. 264, JP 58-145217 A shows a test configuration for a digital filter, in which a selection device is provided to forward data to a processing circuit during the test mode. A filter output signal which has been processed further is supplied to a CPU for fault evaluation purposes. The CPU also supplies the test data.

A publication entitled "Schaltungstest mit Boundary-Scan" [Circuit Test With Boundary Scan], by Auer and Kimmelmann, Heidelberg, Germany, published by Hüthig-Verlag, 1996, pages 6 to 13 describes an application, for testing purposes, of test patterns to inputs of a circuit in order to test the reaction of the circuit. In that context, the expected reaction is compared with the actual one. Pseudo-random test patterns are produced by using shift registers with feedback and are used as test pattern generators.

U.S. Pat. No. 5,754,455 shows a digital filter having a bit-serial architecture. Flipflops contained in the filter are reset to defined states for testing purposes.

SUMMARY OF THE INVENTION

It is accordingly an object of the invention to provide a test configuration and a method for testing a digital electronic filter, which overcome the hereinafore-mentioned disadvantages of the heretofore-known devices and methods of this general type and which can be used to produce a large number of test patterns while still keeping a low level of circuit and control complexity required therefor.

With the foregoing and other objects in view there is provided, in accordance with the invention, a test configuration for a digital electronic filter having an input and an output, comprising an evaluation circuit connected to the output of the filter; and a multiplexer to be toggled or switched over between an operating mode and a test mode, the multiplexer feeding back the output of the filter to the input of the filter in the test mode, for applying a digital output signal from the output of the filter to the input of the filter as a test signal.

With the objects of the invention in view, there is also provided a method for testing a digital filter having an input and an output, which comprises applying a test signal to the filter in a test mode; feeding back at least a response signal to the input as the next test signal; comparing an output signal from the filter with a reference signal in the test mode; and applying a different signal to the filter in an operating mode.

The advantage of the invention is that a relatively high level of test coverage is achieved with just a very simple initial input signal. This is because the filter itself uses the simple input signal to produce a more complex response which can be compared, in any test pass, with inherently known nominal values, that can easily be compared with calculated nominal values.

The invention enables test patterns for a deterministic test to be produced with a very low level of circuit complexity, and additionally enables these test patterns to be laid out to be efficient, i.e. with a short transit time and a high level of fault detection.

In accordance with another feature of the invention, the output of the filter is fed back to the input through a serial line.

In accordance with a further feature of the invention, particularly good and economical developments are achieved by placing a parallel decimation filter at the input. A bit-serial filter which is connected downstream of the decimation filter has an output fed back to the input of the decimation filter.

In accordance with an added feature of the invention, in order to be able to change quickly and easily from the operating mode to the test mode, a changeover switch can be used to connect either a signal which is to be filtered or the fed-back signal to the filter as alternatives.

In accordance with an additional feature of the invention, in principle, very good test results can be attained as a result of applying a unit step as the first test signal, which can easily be achieved by fixing the filter input at logic 1. This is not only very simple to implement, but also the filter needs to calculate the step response from this, and even that results in a relatively high level of test coverage if the individual calculated data words are compared with their nominal value.

In accordance with yet another feature of the invention, the fed-back signal is altered in the feedback path, with scrambling preferably being carried out. This allows even more faults to be detected.

In accordance with a concomitant feature of the invention, "white noise" is used as the input signal. This can be produced by using a pseudo-random generator, for example.

A signal equivalent to "white noise" is preferably obtained by coupling the output signal from the filter to the decimation filter in bit-serial form as the input signal. The constantly and very irregularly changing data in a bit-serial datastream has the same effect as the "white noise source" known from theory.

Other features which are considered as characteristic for the invention are set forth in the appended claims.

Although the invention is illustrated and described herein as embodied in a test configuration and a method for testing a digital electronic filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a block diagram of a test configuration for a digital electronic filter.

DESCRIPTION OF THE PREFERRED EMBODIMENTS

Referring now in detail to the single FIGURE of the drawing, it is seen that a measurement signal, for example coming from a sensor 10, such as an integrated pressure sensor, is supplied through an analog/digital converter 11 to a multiplexer 12. The multiplexer 12 can be toggled between an operating mode and a test mode through the use of a signal TM.

In the operating mode, an output signal from the analog/digital converter 11 is connected through the multiplexer 12 to a decimation filter 13, which decimates the bit stream into parallel data words of relatively low frequency. A further filter 14, typically an IIR, is connected downstream of the decimation filter 13. In order to keep the level of circuit complexity low, the further filter 14 can have a bit-serial structure. An output signal from the entire filter circuit is produced at a first output 15 and at this point a reaction to an input signal can be observed and compared with reference signals.

In the test mode, the output signal from the filter circuit is tested in an evaluation circuit 18. In this context, the reference signals are stored in a data storage device, for example. The evaluation circuit can be in the form of a separate circuit which is connected to the output 15 only during the test mode. As an alternative, it may also be integrated with the filter configuration.

A bit-serial line 16 from a second output is used to apply the bit-serial output signal from the further filter 14, through the multiplexer 12, to the decimation filter 13 as an input signal. If the multiplexer 12 is switched over, irregularly changing data thus reaches the decimation filter 13 and acts as "white noise" there. The two filters 13, 14 are driven through the use of a sequence controller 17.

It is also possible for a non-illustrated parallel filter structure to be used instead of the further bit-serial filter 14. The parallel output signal can then additionally be scrambled, for example by placing the least significant bit onto the most significant bit. The principle of feeding back the output data to the filter input is retained during this procedure.

Even in an embodiment using a further bit-serial filter 14, the bit-serial data on the line 16 can be subjected to serial/parallel conversion and, after scrambling, can be returned to a serial datastream again.

In the test mode, the two filters 13, 14 are first reset to a defined state and the multiplexer 12 is simultaneously switched over to the bit-serial line 16. The result of the reset is that a logic 1 signal, for example, is then first produced at the output on the line 16. It produces a step response signal at the filter output 15, which, when checked in the evaluation circuit 18, possibly even then reveals a multiplicity of faults. The step response signal is additionally fed back to the filter input through the line 16 as a bit-serial datastream.

A datastream with frequent data changes, which affect the output signal from the filter configuration at the output 15, is then obtained on the bit-serial line 16. It may be possible for further faults which are present in the filter configuration to be determined after a particular number of filter passes and comparison of the results at the output 15 with reference values.

I claim:

1. In a test configuration for a digital electronic filter having an input and an output, the improvement comprising:

an evaluation circuit connected to the output of the filter; and a multiplexer to be toggled between an operating mode and a test mode, said multiplexer feeding back the output of the filter to the input of the filter in the test mode, for applying a digital output signal from the output of the filter to the input of the filter as a test signal.

2. The test configuration according to claim 1, including a serial line feeding back the output of the filter to the input of the filter.

3. The test configuration according to claim 1, wherein the digital electronic filter includes a parallel decimation filter disposed at the input of the digital electronic filter and having an input, and a bit-serial filter connected downstream of said decimation filter and having an output fed back to said input of said decimation filter.

4. The test configuration according to claim 1, wherein said multiplexer connects a signal to be filtered in the operating mode.

5. The test configuration according to claim 1, wherein said evaluation unit is integrated in a circuit together with the filter.

6. A method for testing a digital filter having an input and an output, which comprises:

applying a test signal to the filter in a test mode;

feeding back at least a response signal from the output to the input as the next test signal;

comparing an output signal from the filter with a reference signal in the test mode; and applying a different signal to the filter in an operating mode.

7. The method according to claim 6, which further comprises repeatedly feeding back and using the response signal as a test signal.

8. The method according to claim 6, which further comprises serially feeding back the response signal.

9. The method according to claim 6, which further comprises applying a first test signal as a unit step.

10. The method according to claim 6, which further comprises altering the fed-back response signal in a feedback path.

11. The method according to claim 10, which further comprises scrambling the fed-back signal.

12. The method according to claim 10, which further comprises placing a least significant bit of the fed-back signal onto a most significant bit.

* * * * *